United States Patent [19]

Wilson et al.

[11] Patent Number: 5,289,504
[45] Date of Patent: Feb. 22, 1994

[54] SIGNAL DECODING METHOD USING BOTH SIGNAL AND CHANNEL STATE INFORMATION

[76] Inventors: Timothy J. Wilson, 931 Canterbury Dr., Schaumburg, Ill. 60195; Mark R. Poulin, 730 Superior, Oak Park, Ill. 60302; Robert M. Sturgill, 1015 Higgins Quarter #313, Hoffman Estates, Ill. 60194

[21] Appl. No.: 723,107

[22] Filed: Jun. 28, 1991

[51] Int. Cl.⁵ .................... H03K 9/00; H04L 27/06; H04L 27/14
[52] U.S. Cl. ............................. 375/75; 375/94; 375/85; 329/304
[58] Field of Search .................. 329/318, 349, 304; 375/75, 80, 85, 78, 39, 40, 44, 94, 53; 455/134; 371/43

[56] References Cited

U.S. PATENT DOCUMENTS

| | | | |
|---|---|---|---|
| 4,945,549 | 7/1990 | Simon et al. | 375/57 |
| 5,031,193 | 7/1991 | Atkinson et al. | 375/100 X |
| 5,113,416 | 5/1992 | Lindell | 375/97 |
| 5,127,025 | 6/1992 | Okanoue | 375/100 |
| 5,134,635 | 7/1992 | Hong et al. | 375/94 |

OTHER PUBLICATIONS

"Channel Coding with Multilevel/Phase signals", IEEE Transaction on information, Ungerboeck, vol. 28, 1981.

*Primary Examiner*—Curtis Kuntz
*Assistant Examiner*—Tesfaldet Bocure
*Attorney, Agent, or Firm*—Steven G. Parmelee

[57] ABSTRACT

Multilevel angle modulated information is decoded through integral use of channel state information. In a Viterbi Algorithm Trellis Code Modulation decoder (213), channel state information indicating temporal reliability of received symbols is utilized, along with the received symbol information and the Trellis Coding rules themselves, to facilitate a most probable symbol determination. The channel state information may be received signal strength indication information. The latter can be additionally processed by, for example, time delay compensation (401), normalization (403), morphological erosion (404), linearization (406), and/or through static channel detection (408).

24 Claims, 3 Drawing Sheets

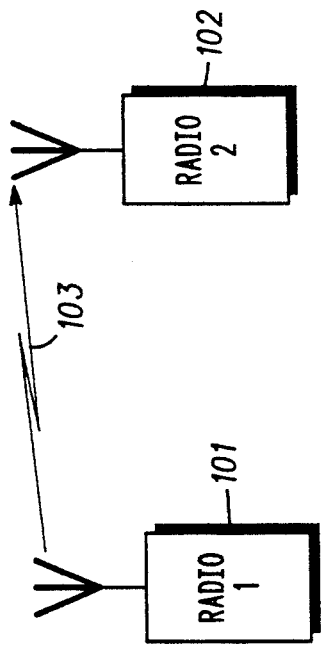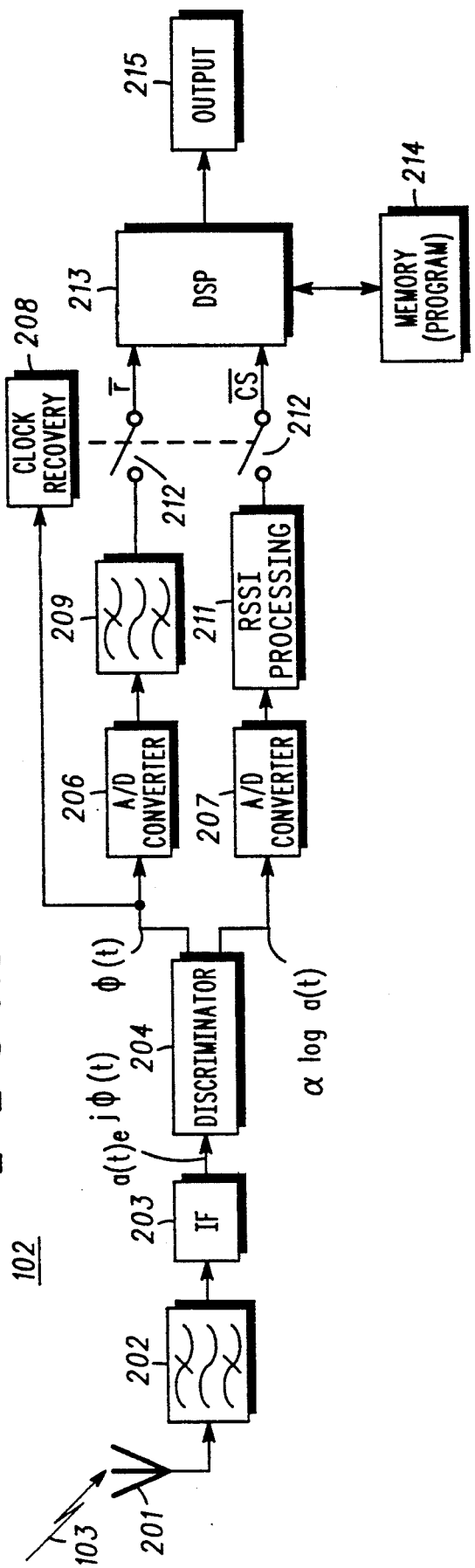

SIGNAL DECODING METHOD USING BOTH SIGNAL AND CHANNEL STATE INFORMATION

FIELD OF THE INVENTION

This invention relates generally to electronic communications, including but not limited to signal decoding methodologies.

BACKGROUND OF THE INVENTION

Communication systems are known in the art. Many such systems support transmission of data from one location to another. This data will often comprise electronic symbols (such as a symbol having a particular amplitude and/or phase with respect to a baseline value) that represent particular data quantities or values. Such symbols, when properly received, can be decoded to allow reconstruction of the original message.

Radio frequency communication systems are also known, where such data is transmitted using a radio frequency channel. In a land mobile operating environment, where the sending and receiving unit are moving with respect to one another, channel degradation occurs due to such phenomena as multipath fading. Such degradation can impact symbol recognition and hence the decoding process, leading to an inaccurate interpretation of the data. Various methods are proposed in the art to protect data from channel degradation. To date, however, such solutions typically represent a compromise of one sort or the other, and hence have one or more problems associated with their adoption, including costly reception platforms to support computationally intensive recovery schemes, data throughput reduction (as necessitated, for example, by inclusion of significant error coding or signal diversity of one type or another), and varying standards of reliability as channel conditions vary.

Accordingly, a need exists for a decoding methodology that will address at least some of the above concerns.

SUMMARY OF THE INVENTION

This need and others are substantially met through provision of the method of recovering an information signal modulated on a carrier signal and transmitted through a channel as disclosed herein. Pursuant to this method, a receiver receives the carrier signal and demodulates it to provide a received information signal. The receiver also processes the carrier signal to determine channel state information that corresponds temporally to the received information signal. The received information signal and the channel state information are then both utilized in a decoding algorithm to recover the information signal.

In one embodiment, the decoding algorithm comprises a Viterbi Algorithm configured to implement a decoder for Trellis Coded Modulation.

In another embodiment, the channel state information corresponds to carrier amplitude information, such as received signal strength indication information.

In another embodiment, processing of the carrier signal to determine channel state information can include a variety of additional processing steps to further condition the channel state information prior to using that information with the estimated information signal in the decoding algorithm. For example, the channel state information can first be normalized, thereby potentially minimizing subsequent computational requirements. The channel state information can also be compensated to accommodate fixed delays that occur in the reception process with respect to determination of the received information signal. The channel state information can further be subjected to morphological erosion to ensure conservative use of the channel state information in the decoding algorithm. Also, this processing can include fixing the channel state information output to the decoder at a fixed value in response to detecting a predetermined channel condition, such as a lack of a faded carrier signal over at least a predetermined period of time. The latter provision avoids that mischief which may occur in a non-fading communication channel when ordinary channel noise might otherwise be interpreted as useful channel state information.

BRIEF DESCRIPTION OF THE DRAWINGS

FIG. 1 comprises a block diagram depiction of a first radio transmitting to a second radio in accordance with the invention;

FIG. 2 comprises a block diagram depiction of a receiving radio in accordance with the invention;

DESCRIPTION OF A PREFERRED EMBODIMENT

Figure 3:
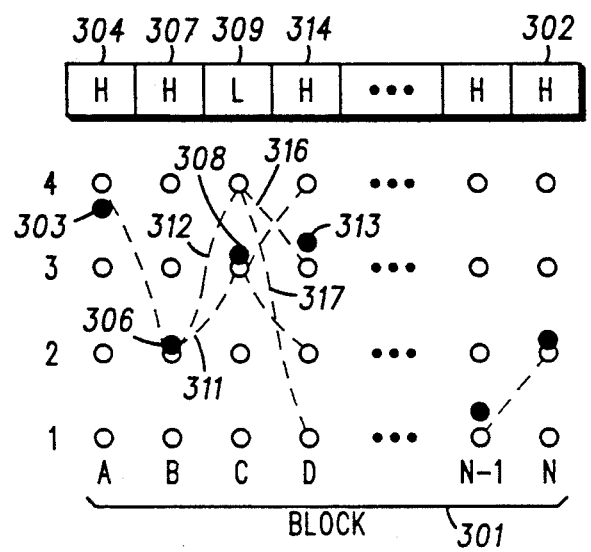
FIG. 3 comprises a timing diagram depicting certain aspects of the decoding process in accordance with the invention.

In FIG. 1, a radio communication system having a first and second radio (101 and 102) is depicted. (Typically, of course, a radio communication system will include many additional radios and other elements of fixed infrastructure. Only two radios are depicted here, as the invention will perhaps be more simply understood by way of a simplified example.) Radio 1 (101) comprises at least a transmitter, and functions, in this embodiment, to angle modulate an information signal on a radio frequency carrier signal. In this particular embodiment, the modulation comprises four level frequency modulation, as well understood in the art. Radio 1 (101) then transmits the modulated carrier signal (103) through a channel to radio 2 (102).

Radio 2 (102) appears in FIG. 2 in more detail. Radio 2 (102) comprises at least a receiver having an antenna (201) for receiving the modulated carrier signal (103). A preselector filter (202) filters the received signal to allow selection of only a particular signal of interest; in this case, the carrier signal (103). An intermediate frequency (IF) unit (203) reduces this signal from the carrier frequency to a selected baseband frequency, all as well understood in the art. (The output of the IF unit (203) can be represented as $a(t)e^{j\Phi(t)}$, where the $a(t)$ term represents the amplitude of the modulated signal and the $e^{j\Phi(t)}$ term represents the modulation information itself. Since, as mentioned above, the information signal here comprises an angle modulation signal, no message information appears in the amplitude term.) The IF (203) provides this $a(t)e^{j\Phi(t)}$ information to a discriminator (204) that performs a demodulation function as well understood in the art. A demodulation output term related to Φ(t) passes through an analog to digital convertor (206) and then through an appropriate receive filter (209) where the digitized samples $\bar{r}$ are then provided through an appropriate sampling mechanism (212) to a decoder (213) where decoding occurs as described in more detail below. (The sampler (212) functions as controlled by a clock recovery unit (208) as well understood in the art.) In this embodiment, the receive filter (209), the clock recovery unit (208), and the decoder (213) are all provided within a digital signal processor (210).

In this embodiment, the discriminator (204) also processes the a(t)e$^{jΦ(t)}$ signal to develop a received signal strength indicator (RSSI) which is, in this embodiment, a signal that is proportional to log a(t). This RSSI value, of course, reflects the amplitude term of the original modulated signal, as well understood in the art and hence provides a useful indicator of channel state conditions. The manner of developing such an RSSI signal is well understood in the art and hence need not be explained here in further detail.

The RSSI information is processed through an analog to digital convertor (207), and subjected to further RSSI processing (211) (again within the digital signal processor (210)) as explained below in more detail. The resulting channel state information $\bar{cs}$ is then passed to the decoder (213) through a sampler (212), again in synchronicity with clock recovery.

So configured, both discrete received symbol information $\bar{r}$ elements and temporally corresponding discrete channel state information $\bar{cs}$ elements are provided in a controlled manner to the decoder (213). In this embodiment, both information sets of elements are utilized within a decoding algorithm to obtain a reliable decoded message. To facilitate this, the digital signal processor (210) (which may be, for example, a Motorola DSP 56000 or DSP 96000 family device) will typically couple to a memory (214), which memory (214) stores appropriate programming information for the digital signal processor (213). Further, if desired, an appropriate output device (215) (such as a graphics display) can also couple to the digital signal processor (213) to allow provision of the recovered message to a radio user.

Referring now momentarily to FIG. 3, general operation of the digital signal processor based decoder will be provided. The received information signal comprises a plurality of symbols, wherein each symbol may have any of four discrete levels, with each level corresponding to a particular data value. These symbols are processed in blocks (301), with each block having a predetermined number of symbols. Typically, the received symbol values do not correspond exactly with the predetermined values for a given symbol due to the effects of channel noise. For example, received symbol A (303) does not exactly correspond with any of the four levels depicted (i.e., levels 1, 2, 3, or 4). The decoder must therefore determine which of the four levels is most likely the correct one.

One simple approach would be to simply select that candidate level that is nearest to the received level. Such a criteria, while useful, will not ensure correct decoding under all circumstances. In part because of this, those skilled in the art often make use of Trellis Coded Modulation. Trellis Coding places restrictions with respect to subsequent symbols that can potentially validly appear next in a stream of symbols. As an illustrative example only, if symbol B (306) as depicted in FIG. 3 in fact comprises a level 2 symbol, than either a subsequent path (311) to a level 3 or a path (312) to a level 4 symbol might then be valid, but not to a level 2 or a level 1 symbol. By knowing the nature of such restrictions in a Trellis Coded Modulation environment, the decoder can make more informed decisions regarding the decoding process.

Trellis Coding and decoding is well understood in the art, and hence will not be described here in any further detail, the above description being adequate to facilitate an understanding of the invention.

It is also known in the art to use the Viterbi Algorithm to implement a decoder for Trellis Coded Modulation. (The interested reader may wish to consider the article entitled "The Viterbi Algorithm," by G. David Forney, Jr., as appears in the March, 1973 issue of The Proceedings of the IEEE.) The Viterbi Algorithm essentially comprises a maximum likelihood process which includes, as a key computation, a computation of survivor metrics which, in the present context, may be simply stated as $$\log P(r_j|s_i, CS_j)$$

for all signals $s_i$, where "P" refers to probability, "r" refers to actual received values, "s" refers to symbol levels, and "cs" refers to channel state information. The applicants have modelled their Viterbi Algorithm implementation presuming Gaussian noise, such that the above reduces to $$||r_j - s_i||^2 cs_j^2 \text{ for all signals } s_i$$

So represented, it can be seen that the channel state information effectively becomes a scaling factor within the Viterbi Algorithm. When the channel state value that corresponds temporally to a particular received symbol value is large, thereby reflecting a symbol received under likely optimum reception conditions, the result of the calculation will be scaled higher to reflect the increased likelihood of its reliability. Conversely, as the channel state value drops, reflecting a less optimum channel condition, the calculation result will be scaled in the opposite direction, thereby reflecting the reduced reliability of the final result.

A simple illustration of the above will now be offered.

Referring still to FIG. 3, each received symbol (A-N) has temporally associated therewith a corresponding channel state value (302). For purposes of illustration, these channel state values (302) are simplified here to reflect either a high reliability (H) or a low reliability (L) scaling. As depicted, of the first four symbols A-D (303, 306, 308, and 313), three have a high reliability (304, 307, and 314) associated therewith and one (308) has a low reliability (309) associated therewith. The Viterbi Algorithm, taking this channel state information into account, operates generally as follows.

Symbol B (306) has close proximity to a level two symbol and has a high reliability (307) associated therewith. Presuming symbol B (306) to therefore be a level two symbol, symbol C (308) is therefore either a level three or a level four symbol. Symbol C (308), although having close proximity to a level three position, has a low reliability (309) associated with it. This becomes particularly pertinent when considering the following symbol D (313) which has relatively close proximity to a level three symbol and has a high reliability (314)

associated with it. If symbol C (308) in fact constitutes a level three symbol, then symbol D (313) will be constrained to either a level two or level four position for the reasons explained earlier. Neither a level two or level four position squares well with the received position of symbol D (313), however. If, on the other hand, symbol C (308) constitutes a level four symbol, then either a path (316) to a level three symbol or a path (317) to a level one symbol is valid. The level three position is, of course, more proximal to and hence a better fit with symbol D (313). Since symbol D (313) has a high reliability (314) associated therewith, and symbol C (308) has a low reliability (309) associated with it, the decoder will determine that symbol C (308) is most probably a level four symbol since that conclusion would best satisfy the probability analysis of the Viterbi Algorithm.

Therefore, those skilled in the art will appreciate that the decoding reliability of a Viterbi Algorithm based decoder can be significantly enhanced when dealing with radio frequency modulated information that is subjected to regular channel disruptions by including channel state information within the decoding algorithm itself. The reliability scaling that results effectively avoids many of the problems of the prior art.

Figure 4:
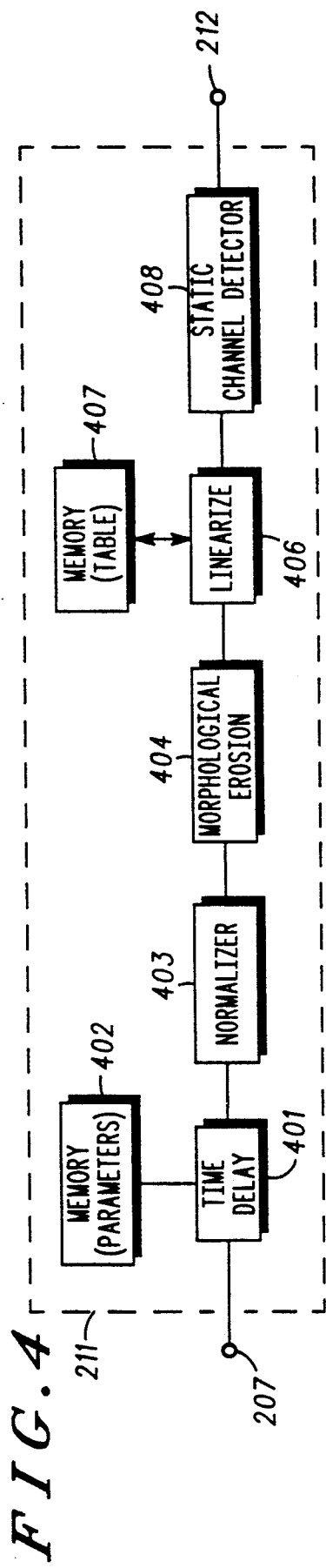
FIG. 4 comprises a block diagram depiction of channel state processing in accordance with the invention.

As noted above with respect to FIG. 2, subsequent to digitization of the RSSI signal, the RSSI information is further processed (211) prior to providing the channel state information to the decoder. That RSSI processing unit (211) will now be described in more detail with reference to FIG. 4. The analog to digital convertor (207) provides the digitized version of the RSSI information to a plurality of serially oriented blocks, wherein various processes can be effected to accommodate various sensitivities and/or issues in a particular application. For example, time delay (401) can be inserted to delay provision of the RSSI information to the DSP. Typically, such delay will represent a compensating factor to accommodate fixed processing delays experienced in the processing of the modulated signal information as occurs, for example, in the receive filter (209). The amount by which the RSSI information is delayed is determined by referring to one or more appropriate delay parameters as stored in an associated memory (402).

Next, the RSSI information is normalized (403). For example, if all RSSI values for a particular sampled period of time fall within a range of values from 1 to 5, then the signal values could be normalized by subtracting "1" from each of them to produce a series of values from 0 to 4. Such normalization would potentially better accommodate range limitations and/or computational capabilities downstream.

Due to various uncontrollable and unpredictable delays, time offsets can and will occur, thereby rendering uncertain the precise temporal alignment between the RSSI values and corresponding received symbols. This can cause, for example, an unreliably received symbol to be incorrectly considered reliable, and vice versa. In the Viterbi Algorithm, when modified as suggested by the applicant to be sensitive to channel state information, it is better in practice to proceed under the assumption that an accurately received symbol may be unreliable than it is to proceed under the assumption that an inaccurately received symbol is likely reliable. To compensate for this, the RSSI symbols are next subjected to morphological erosion (404). In effect, discrete elements of the received signal strength indication information (such as, for example, individual RSSI values) are processed as a function of previous and following discrete elements. Such morphological erosion is perhaps most easily explained with reference to the following equation:

$$RSSI_{out\ j} = MIN[RSSI_{in\ j+k}] \text{ for all } j \text{ in block and for } k = -2 \ldots +2$$

Figure 5:
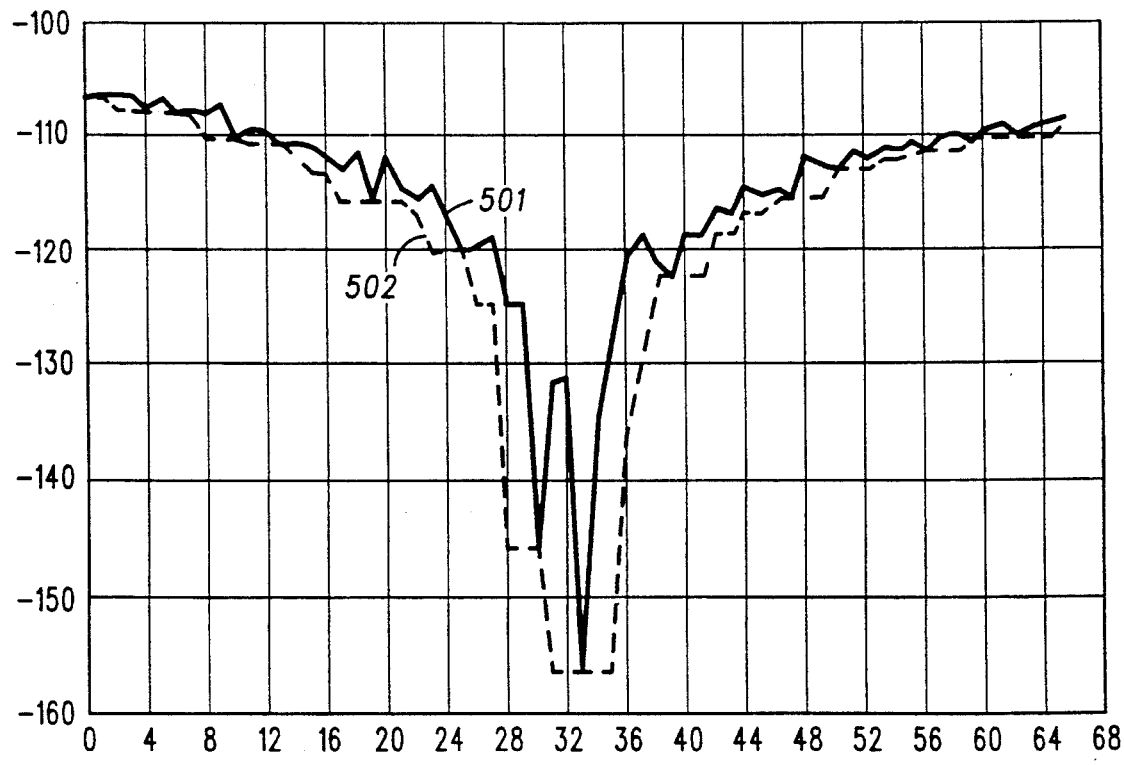
FIG. 5 comprises a plot depicting morphological erosion in accordance with the invention.

A plurality of RSSI values over a predetermined block of time are obtained. For example, 68 such RSSI values are depicted in FIG. 5 by reference numeral 501. By implementing the above equation, each output RSSI value provided by the morphological erosion process will be equal to the minimum value in the set comprising the particular value and the two values on either side thereof, thereby giving rise to an output RSSI value as depicted in FIG. 5 by reference numeral 502. This morphological erosion of the RSSI values will guarantee that any inaccurately received symbol is interpreted as inaccurate as long as the time offset of concern is less than k samples, thereby more conservatively presenting the RSSI information for use in the decoder.

Next, the RSSI information can be linearized (406) as desired, referring, as necessary, to a table of information as stored in a memory (407). As noted above, the RSSI information is substantially proportional to log a(t). In this particular application, the RSSI information is converted from logarithmatic form to linear form. By using an appropriate look-up table as well understood in the art, one will compensate for linearity errors in the discriminator.

Figure 6:
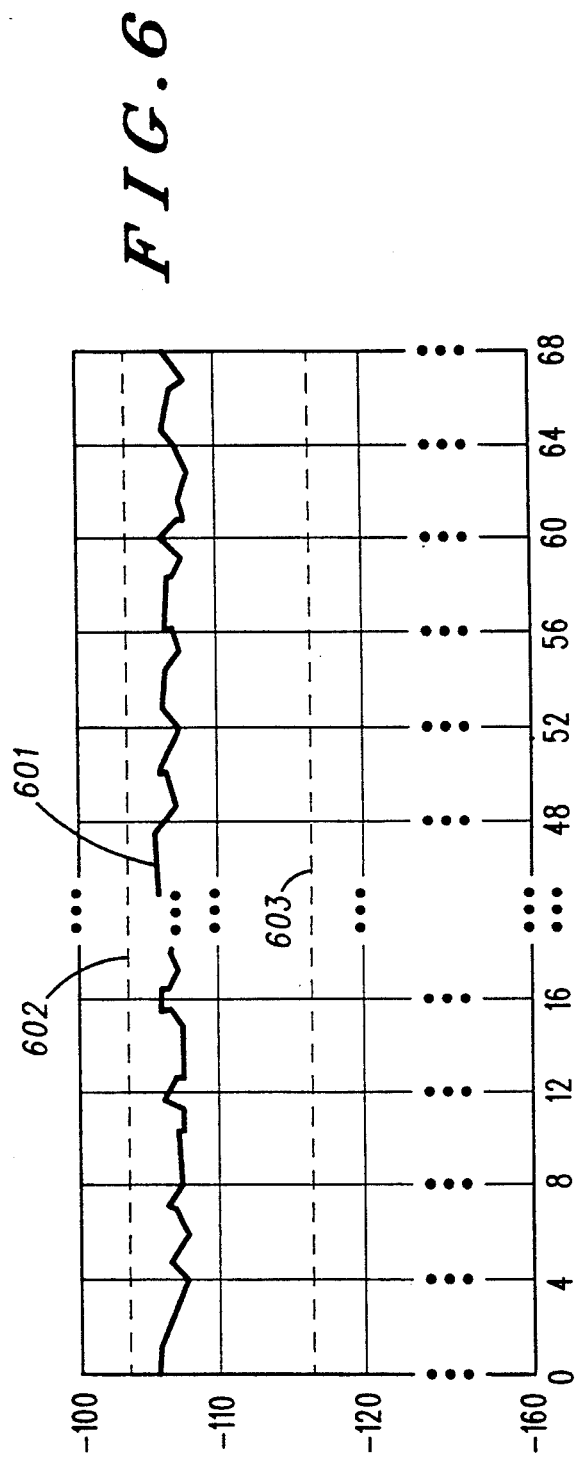
FIG. 6 comprises a plot depicting static channel detection aspects in accordance with the invention.

Lastly, the RSSI information can be processed in a static channel detector. With momentary reference to FIG. 6, from time to time, a block of RSSI samples as depicted by reference numeral 601 will not exhibit any fades. The RSSI values will not be constant, however, due to channel noise and other minor influencing phenomena. Such channel noise is typically not a valid concern with respect to the decoding process. Therefore, when a lack of fades within the sampling period is detected (as evidenced by a lack of sufficient variation in signal amplitude), the static channel detector (408) will output a constant RSSI value, such as depicted at reference numerals 602 or 603. In effect, when a predetermined condition is detected, an RSSI output having a substantially constant value is provided. The predetermined condition comprises a predetermined attribute of the input RSSI information; in this case the predetermined attribute reflects a lack of a faded carrier over at least a predetermined period of time.

As should be clear, the particular value output by the static channel detector (408) is not particularly important; rather, is only important that the value be essentially constant. With the scaling factor then being constant, all data will be influenced by the same amount in the Viterbi Algorithm, and the channel state information will essentially become a non-factor during such processing periods.

Those skilled in the art will recognize that fewer than all of the above described RSSI processing techniques could be selected to accommodate the needs of a particular application.

So configured, a number of important benefits are obtained. Most importantly, the problems of a disturbed channel are significantly compensated by providing channel state information that is temporally associated with corresponding data elements to a decoder that uses both data streams to decode the message. The channel state information itself can be compensated in a variety of ways in order to enhance either the computational efficiency of the decoder process, or to otherwise minimize undesirable occasional errors that such information might otherwise introduce by its presence.

What is claimed is:

1. A method of recovering an information signal modulated on a carrier signal and transmitted through a channel, comprising the steps of:
    A) receiving the carrier signal;
    B) demodulating the received carrier signal to provide a received information signal;
    C) processing the received carrier signal to determine channel state information corresponding temporally to the received information signal;
    D) combining and processing the received information signal and the temporally corresponding channel state information in a trellis coded decoding algorithm to recover the information signal.

2. The method of claim 1, wherein the decoding algorithm comprises a Viterbi Algorithm.

3. The method of claim 1, wherein the channel state information corresponds to carrier amplitude information for the received carrier signal.

4. The method of claim 3, wherein the carrier amplitude information comprises received signal strength indication information.

5. The method of claim 4, wherein the step of processing the received carrier signal includes the step of processing the received signal strength indication information to provide the channel state information.

6. The method of claim 5, wherein the step of processing the received signal strength indication information includes the step of compensating the received signal strength indication information to accommodate fixed delays.

7. The method of claim 6, wherein the fixed delays correspond to delays incurred while processing the received information signal.

8. The method of claim 5, wherein the step of processing the received signal strength indication information includes the step of normalizing the received signal strength indication information.

9. The method of claim 5, wherein the step of processing the received signal strength indication information includes the step of morphologically eroding the received signal strength indication information.

10. The method of claim 5, wherein the step of processing the received signal strength indication information includes the step of processing at least some discrete elements of the received signal strength indication information as a function of at least one other discrete element of the received signal strength indication information.

11. The method of claim 5, wherein the step of processing the received signal strength indication information includes the steps of:
    detecting a predetermined condition;
    when the predetermined condition is detected, providing a received signal strength indication information having a substantially constant value.

12. The method of claim 11, wherein the predetermined condition comprises a predetermined attribute of the received signal strength indication information.

13. The method of claim 12, wherein the predetermined attribute reflects a lack of a faded carrier signal over at least a predetermined period of time.

14. A method of recovering an information signal modulated on a carrier signal and transmitted through a channel, comprising the steps of:
    A) receiving the carrier signal;
    B) demodulating the received carrier signal to provide a received information signal;
    C) processing the received carrier signal to determine channel state information corresponding temporally to the received information signal;
    D) processing the temporally corresponding channel state information to provide processed channel state information;
    E) combining and processing the received information signal and the temporally corresponding processed channel state information in a trellis coded modulation decoding algorithm to recover the information signal.

15. The method of claim 14, wherein the step of processing the channel state information includes the step of compensating the channel state information to accommodate fixed delays.

16. The method of claim 15, wherein the fixed delays correspond to delay incurred while processing the received information signal.

17. The method of claim 14, wherein the step of processing the channel state information includes the step of normalizing the channel state information.

18. The method of claim 14, wherein the step of processing the channel state information includes the step of morphologically eroding the channel state information.

19. The method of claim 14, wherein the step of processing the channel state information includes the step of processing at least some discrete elements of the channel state information as a function of at least one other discrete element of the channel state information.

20. The method of claim 14, wherein the step of processing the channel state information includes the steps of:
    detecting a predetermined condition;
    when the predetermined condition is detected, providing a channel state information having a substantially constant value.

21. The method of claim 20, wherein the predetermined condition comprises a predetermined attribute of the channel state information.

22. The method of claim 21, wherein the predetermined attribute reflects a lack of a faded carrier signal over at least a predetermined period of time.

23. A method of recovering an information signal that has been angle modulated on a carrier signal and transmitted through a radio frequency channel, comprising the steps of:
    A) receiving the carrier signal;
    B) demodulating the received carrier signal to provide a received information signal comprising a plurality of discrete information elements;
    C) processing the received carrier signal to determine a plurality of discrete elements of channel state information, wherein each discrete element of channel state information corresponds temporally to one of the discrete information elements;
    D) combining at least some of the discrete information elements and temporally corresponding discrete elements of channel state information in a trellis coded Viterbi decoding algorithm to recover the information signal, such that discrete information elements that temporally correspond to a discrete element of channel state information that indicates faded reception conditions are weighted as being less reliable than other discrete information elements in the trellis coded Viterbi decoding algorithm.

24. A radio, comprising:
A) a receiver;
B) a discriminator operably coupled to the receiver, and having a demodulated received signal output and a channel state information signal output;
C) signal processing means operably coupled to the discriminator for receiving:
 i) the demodulated received signal; and
 ii) the channel state information signal;
for combining at least some elements of the demodulated received signal with at least some temporally corresponding elements of the channel state information signal in a trellis coded decoding algorithm to recover an originally transmitted message, such that the elements of the channel state information signal effectively weight corresponding elements of the demodulated received signal.

* * * * *